United States Patent [19]

Ferrand et al.

[11] Patent Number: 4,935,934

[45] Date of Patent: Jun. 19, 1990

[54] MIXED LANTHANIDE-MAGNESIUM GALLATES AND LASER USING MONOCRYSTALS OF THESE GALLATES

[75] Inventors: Bernard Ferrand, Voreppe; Yves Grange, Grenoble; Dominique Lefebvre, Alfortville; Jeannine Thery, Paris; Daniel Vivien, Garches, all of France

[73] Assignees: Centre National de la Recherche Scientifique; Commissariat a l'Energie Atomique, both of France

[21] Appl. No.: 334,073

[22] Filed: Apr. 6, 1989

Related U.S. Application Data

[62] Division of Ser. No. 59,068, Jun. 8, 1987.

[30] Foreign Application Priority Data

Jun. 10, 1986 [FR] France .............................. 86 08364

[51] Int. Cl.$^5$ .............................................. H01S 3/16
[52] U.S. Cl. ................................. 372/41; 252/301.4 R
[58] Field of Search .................... 372/41; 252/301.4 R

[56] References Cited

U.S. PATENT DOCUMENTS 3,500,232  3/1970  Geusic et al. ........................ 372/41
4,441,049  4/1984  Verstegen et al. ............ 252/301.4 R
4,606,846  8/1986  Kahn et al. ................... 252/301.4 R Primary Examiner—Léon Scott, Jr.
Attorney, Agent, or Firm—Michael N. Meller

[57] ABSTRACT

Mixed lanthanide-magnesium gallates and laser using monocrystals of these gallates. This laser has two flash lamps for longitudinally pumping a monocrystalline rod of a magnetoplumbite-type gallate emitting a light ranging from the UV to the IR, which is amplified between two mirrors and a polarizing prism serving to pass to the outside of the laser the amplified light beam. The gallate is of formula:

$$[La_{1-x}M_x^1]_{(1-z/3)k}Mg_{(1-z)k}[Ga_{1-v-t}M_v^2Cr_t]_{(11+z)k}O_{19k}$$

in which $M^1$ represents Nd, Pr, Ce, Nd-Ce or Pr-Ce in the trivalent state; $M^2$ represents aluminium, optionally partly substituted by scandium and/or indium; k is a number between 0.94 and 1; x is a number between 0 and 1; t is a number such that $0 \leq t \leq 0.05$, provided that t is $\neq 0$ when x=0 and that x is $\neq 0$ when t=0; v is a number such that $0 \leq v + t < 1$ and z is a number between 0 and 0.5.

17 Claims, 3 Drawing Sheets

MIXED LANTHANIDE-MAGNESIUM GALLATES AND LASER USING MONOCRYSTALS OF THESE GALLATES

This is a division of application Ser. No. 059,068, filed June 8, 1987.

BACKGROUND OF THE INVENTION

The present invention relates to mixed lanthanide-magnesium gallates obtained more particularly in the form of monocrystals and having a particular application in the field of microlasers for integrated optics, or telecommunications by optical fibres and in the field of power lasers emitting in the infrared, visible or ultraviolet ranges, making it particularly possible to effect treatments of materials (welding, drilling, marking, surface treatment), photochemical reactions, controlled thermonuclear fusion, or the polarization of atoms of a gas, such as helium. Microlasers can also be used in the medical field for treating the skin or in microsurgery.

Known mixed lanthanide-magnesium oxides are in particular mixed lanthanum-magnesium gallates of the magnetoplumbite type prepared in pulverulent form for the first time by Philips. These manganese-doped gallates have luminescence properties which have in particular been described in an article "Luminescence of $Mn^{2+}$ in $SrGa_{12}O_{19}$, $LaMgGa_{11}O_{19}$, and $BaGa_{12}O_{19}$" published in the journal of solid state chemistry 7, pp 468-473, 1973 by J. Verstegen. These gallates obtained solely in powder form have significant luminescent properties making it possible to use them in displays. However, they have no laser effect.

FR-A-2 205 733 and US-A-4 216 408 also disclose lanthanum-magnesium gallates containing in particular manganese-doped strontium, which also has luminescent properties, but has no laser effect.

Other mixed lanthanide-magnesium oxides are in particular lanthanum-neodymium-magnesium aluminates, called LNA of formula: $La_{1-x}Nd_xMgAl_{11}O_{19}$ with $0 < x \leq 1$ and which are in particular covered by FR-A-2 448 134 and EP-A-0 043 776.

These aluminates obtained in monocrystalline form have laser properties comparable to those of neodymium-doped aluminium and yttrium garnet known under the abbreviation YAG:Nd and neodymium ultraphosphate ($NdP_5O_{14}$) emitting in the infrared.

LNA has two particularly interesting laser emission wavelengths at 1.054 and 1.083 micrometers, covering that of YAG at 1.064 micrometers. Moreover, it also has an emission wavelength range around 1.32 micrometers, which corresponds to the smallest attenuation by silica optical fibres, thus permitting the transmission of maximum information with minimum losses.

However, the efficiency of the laser emission of LNA is low, like that of YAG, so that at present it cannot be used in all applications.

SUMMARY OF THE INVENTION

The present invention relates to mixed lanthanide-magnesium gallates, which can be produced in the form of monocrystals and which have a laser emission with an efficiency or yield exceeding that of LNA.

According to the invention, these mixed gallates are characterized in that they are of the following formula (I):

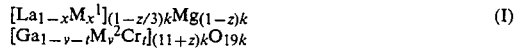

in which $M^1$ is chosen from among neodymium, praseodymium, cerium, neodymium-cerium and praseodymium-cerium pairs, said elements being trivalent; $M^2$ represents at least one trivalent element chosen from among aluminium, scandium and/or indium, provided that the total number of scandium and/or indium atoms per formula unit is below $0.15(11+z)k$; k represents a number between 0.94 and 1; x represents a number between 0 and 1; t represents a number such that $0 \leq t \leq 0.05$, provided that t is $\neq 0$, when $x=0$ and that x is $\neq 0$ when $t=0$; v represents a number such that $0 \leq v+t < 1$; z represents a number between 0 and 0.5. In addition, said gallates are monophase and have a crystalline structure of the magnetoplumbite type and a hexagonal mesh.

The compounds according to the invention can be produced in the form of monocrystals having a laser efficiency higher than that of LNA, so as to permit competition with YAG and $NdP_5O_{14}$ for all their laser applications.

Thus, the inventors have found that the inadequate efficiency of the laser emission of LNA was mainly linked with an excessively high crystal field at the site of the neodymium, due to an inadequate distance between the neodymium and oxgen atoms. The inventors then had the idea of increasing the neodymium-oxygen distances by effecting a partial or total substitution of the aluminium by gallium, scandium and/or indium in the LNA lattice, gallium, scandium and indium having larger ion radii than that of aluminium.

Advantageously $M^2$ at least partly represents aluminium and $M^1$ neodymium.

When the lanthanide-magnesium gallate is in accordance with formula $La_{1-x}Nd_xMg(Ga_{1-v}Al_v)_{11}O_{19}$, v must also satisfy the following condition: $v < 0.143(x-0.3)$ for $0.3 \leq x \leq 1$, whereas for $0 < x < 0.3$, v can assume all values between 0 and 1, y including the value 0.

The mixed gallate according to the invention in which $M^1$ represents neodymium or the neodymium-cerium pair can be produced in monocrystalline form and used as a laser emitter in a power laser, in the infrared range.

In the case of the neodymium-cerium pair, the mixed gallate according to the invention advantageously has the following formula: $La_{1-x}(Nd_{1-p}Ce_p)_xMg(Ga_{1-v}Al_v)_{11}O_{19}$, p being a number such that $0 \leq p \leq 1$. In particular, v equals 0.5 and x 0.2 or 0.5.

The term power laser is understood to mean a laser emitting approximately 100 W.

When $M^1$ represents praseodymium or the praseodymium-cerium pair, the corresponding mixed gallates produced in monocrystalline form can be used as laser emitters in a laser, particularly a power laser, emitting in the visible range and in particular in the yellow and red.

The gallates according to the invention in which $M^1$ represents praseodymium are in particular in accordance with the following formula:

For example v can assume values 0.4 or 0.7 and x all values between 0 and 1, including the value 1, no matter what is v.

When $M^1$ represents cerium, the corresponding mixed gallates, produced in the form of monocrystals can be used as laser emitters emitting in the ultraviolet or the blue-violet with tunability.

These cerium-based gallates have in particular the following formula:

$$La_{1-x}Ce_xMg(Ga_{1-v}Al_v)_{11}O_{19} \text{ with } 0<x\leq 1.$$

When in formula (I) x=0 and consequently t is not zero, the corresponding mixed gallates, produced in the form of monocrystals, can be used as laser and in particular power laser emitters, emitting in the red and near infrared with tunability between 680 and 800 nm, the laser emission being due to chromium.

Chromium gallates are in particular of formula $LaMg(Ga_{1-v-t}Al_vCr_t)_{11}O_{19}$, with $0\leq v\leq 1$ and $t\neq 0$ and in particular t is equal to 0.01.

It is known that the laser effect is dependent on certain parameters and in particular the life of the excited state $E_1$ of the ions responsible for the laser effect (energy level above the normal level). If the life of the excited state $E_1$ is adequate, the population inversion corresponding to the number of ions in the excited state exceeding the number of ions in the normal state can take place.

For neodymium, the excited state $E_1$ corresponds to the energy level $^4F_{3/2}$, for praseodymium the excited state for a visible emission is the energy level $^3P_0$ and for cerium the excited state corresponds to the configuration (5d). The possible transition between the excited state $E_1$ and the normal level of neodymium, praseodymium, cerium and chromium are in particular described in the article in Phys. Status Sol. (a) 87, 11, 1985 entitled "Achievements in the Field of Physics and Spectroscopy of Activated Laser Crystals" by A. Kaminskii.

Research has shown that the higher the lanthanum content of the mixed compound, the greater the increase in the life of the excited state. Conversely, the intensity of the fluorescence increases with the concentration of luminophor ions. However, an excessive luminophor ion quantity assists interactions between said ions, which are prejudicial to the fluorescence.

In the case of neodymium, the use of a compound satisfying the above-mentioned formula (I), in which x is such that $0.1\leq x\leq 0.5$ would seem to be a very good compromise with regards to the neodymium ion quantity.

To effect the population of the excited state $E_1$, the luminescent ions are excited to an energy level $E_2$ exceeding the excited state $E_1$. The population of the upper energy state $E_2$ is obtained by light absorption or optical pumping. As the energy level $E_2$ is very unstable, the luminescent ions (praseodymium, cerium, neodymium, chromium) are spontaneously de-excited to the excited energy state $E_1$.

In view of the fact that the absorption peaks of neodymium are very narrow, the partial substitution of gallium by chromium aids the light absorption by the gallate. Thus, the chromium has in the visible range two absorption bands which are much wider than those of neodymium, a first band ranging from approximately 400 to 55 nm and a second band from 600 to 700 nm.

After being brought to the excited state by light absorption in one or other of these spectral bands, the chromium transfers its energy to the neodymium ions, thus permitting the population of energy level $E_1$. This energy transmission is possible, because the energy difference between the normal state and the excited state of chromium ions is close to the energy difference between the normal state and the superexcited state $E_2$ of the neodymium ions.

The optical pumping in the gallates according to the invention can also be ensured by partly substituting the praseodymium or neodymium by cerium. Thus, cerium has absorption bands which are as wide as those of chromium in the ultraviolet or violet-blue ranges and the energy difference between the normal state and the excited state of cerium is close to the energy difference between the normal state and the superexcited state of neodymium or praseodymium.

It is also possible to envisage chromium-cerium codoping in the specific case of neodymium.

The wide absorption bands for chromium and cerium are linked with the nature of their electronic transitions involving one or more "d" levels. Chromium and cerium are called laser emission sensitizers, whereas neodymium and praseodymium are called laser emission activators. The sensitizer and activator are chosen as a function of the wavelength used for optical pumping and the desired transmission wavelength. In the absence of praseodymium and neodymium, chromium or cerium serves as the activator.

The mixed gallates according to the invention are obtained by intimately mixing in stoichiometric proportions the high purity commercially available powders of oxides of lanthanum, magnesium, gallium, chromium, $M^1$ and $M^2$, then raising the mixture obtained to a temperature of approximately 1400° C. After grinding the product obtained, a powder results which can then be treated with a view to producing a mixed gallate monocrystal by solidification.

Gallate powders can also be obtained by coprecipitation in the amorphous state of hydroxides of lanthanum, $M^1$, magnesium, gallium, $M^2$ and chromium. This coprecipitation is carried out with ammonia in an aqueous solution containing a mixture of nitrates of the different metallic elements of gallate.

The magnesium, aluminium and chromium nitrates are commercially available, whereas the gallium, lanthanum, neodymium, praseodymium and cerium nitrates are respectively obtained by dissolving metallic gallium, $La_2O_3$, $Nd_2O_3$, $Pr_2O_3$ and $Ce_2O_3$ in nitric acid.

The unfiltered mixture of nitrates obtained is firstly treated at 300° C. in a ventilated atmosphere up to dehydration and the complete elimination of the ammonium nitrate and is then raised to a temperature of 1300° C. After grinding, the powder obtained can be treated with a view to producing a monocrystal by solidification.

The pulverulent oxides of the different elements used are in the form of a powder having a grain size distribution between 1 and 10 micrometers and a purity exceeding 99.99% in order to obtain a maximum efficiency for laser emission.

The monocrystals of gallates can be obtained by melting the previously obtained pulverulent material in a platinum crucible, followed by slow cooling for gallium-rich compositions. This method can be used for obtaining small monocrystals with a size of a few mm usable in microlasers. In order to obtain monocrystals of several centimeters, it is advantageous to use the Czochralski pulling growth method using an iridium or other metal crucible (e.g. Mo).

Other methods for producing monocrystals on the basis of fusion or melting can also be employed, such as the Verneuil, fusion zone, Bridgmann and other methods.

The aforementioned production processes have made it possible to obtain a large number of gallates according to the invention in the form of powder and/or monocrystals, whose structure has been identified by X-ray diffraction and whose crystalline parameters have been measured.

BRIEF DESCRIPTION OF THE DRAWINGS

The invention is described in greater detail hereinafter relative to non-limitative embodiments and the attached drawings, wherein show.

$$La_{0.95}Nd_{0.05}Mg(Ga_{0.45}Al_{0.55})_{11}O_{19}$$

i.e. the variation of $J_f$, in arbitrary units, as a function of the Lambda wavelength expressed in micrometers.

Figure 5:
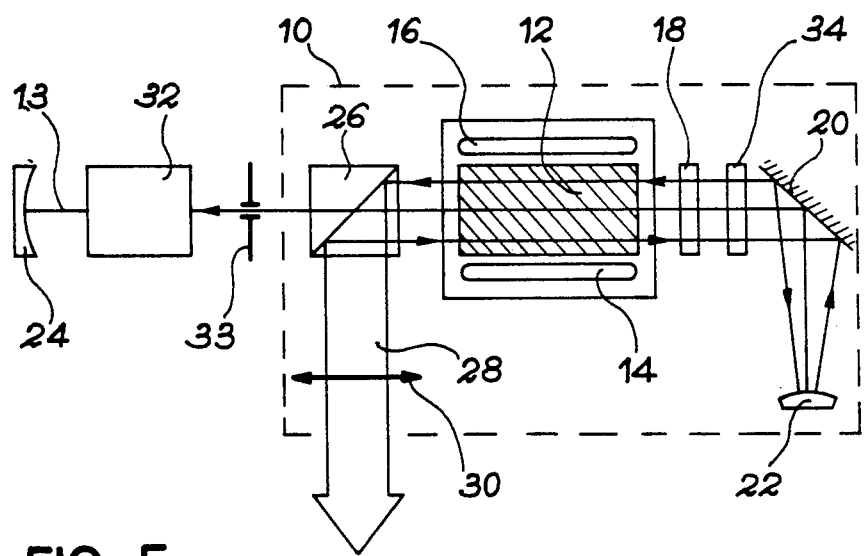

FIG. 5: Diagrammatically a pulsed power laser using a gallate monocrystal according to the invention.

DETAILED DESCRIPTION OF THE PREFERRED EMBODIMENTS

Figure 1:
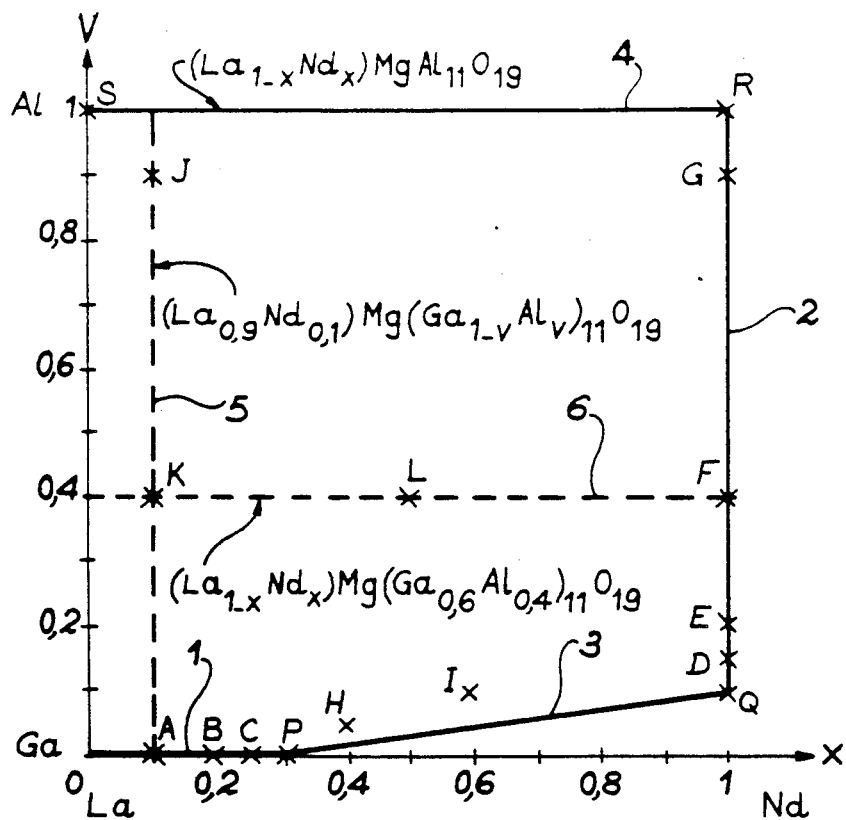
FIG. 1: A phase diagram defining the range of existence of monophase gallates according to the invention of formula $La_{1-x}Nd_xMg(Ga_{1-v}Al_v)_{11}O_{19}$; the abscissa giving the neodymium concentration, i.e. the value of x and the ordinate the aluminium concentration, i.e. the value of v.

FIG. 1 shows the existence range for the phases of gallates of the magnetoplumbite type inventively complying with the formula:

$$(La_{1-x}Nd_x)Mg(Ga_{1-v}Al_v)_{11}O_{19}$$

corresponding in formula (I) to t=0, z=0 and k=1. The aluminium composition is plotted on the ordinate and the neodymium composition on the abscissa. This graph was plotted experimentally.

For v=0, the gallates are of formula:

$$La_{1-x}Nd_xMgGa_{11}O_{19}$$

which corresponds to a total substitution of the aluminium by gallium in LNA. The synthesis tests for the compound $NdMgGa_{11}O_{19}$ led to oxide mixtures including garnet $Nd_3Ga_5O_{12}$, spinel $MgGa_2O_4$ and β-galline $Ga_2O_3$. The monophase gallates of the magnetoplumbite type were obtained for $0<x<0.3$ and are those of line 1 in FIG. 1. Above $x=0.3 Nd_3Ga_5O_{12}$ garnet is present.

Examples of monophase gallates obtained in the form of powder at 1400° C. and for which v=0 and 0<x<0.3, are compounds A, B and C (cf. FIG. 1) respectively complying with formulas:

| A | $La_{0.9}Nd_{0.1}MgGa_{11}O_{19}$ |
| B | $La_{0.8}Nd_{0.2}MgGa_{11}O_{19}$ |
| C | $La_{0.75}Nd_{0.25}MgGa_{11}O_{19}$ |

For x=1, the gallates are in accordance with formula:

$$NdMg(Ga_{1-v}Al_v)_{11}O_{19}.$$

The inventors have found that the total substitution of lanthanum by neodymium is only possible in gallates in which part of the gallium is substituted by aluminium. Monophase gallates of the magnetoplumbite type were obtained for v>0.1.

Examples of compounds according to line 2 (x=1) in FIG. 1 are compounds D, E, F and G, respectively corresponding to the formulas:

| D | $NdMg(Ga_{0.85}Al_{0.15})_{11}O_{19}$ |
| E | $NdMg(Ga_{0.80}Al_{0.20})_{11}O_{19}$ |
| F | $NdMg(Ga_{0.60}Al_{0.40})_{11}O_{19}$ |
| G | $NdMg(Ga_{0.10}Al_{0.90})_{11}O_{19}$ |

For x between 0.3 and 1 and v at the most equal to 0.1, there are monophase compounds of the magnetoplumbite type in accordance with the invention. Examples are compounds H and I respectively complying with formulas:

$$La_{0.6}Nd_{0.4}Mg(Ga_{0.95}Al_{0.05})_{11}O_{19}$$

$$La_{0.4}Nd_{0.6}Mg(Ga_{0.9}Al_{0.1})_{11}O_{19}.$$

In general terms, the monophase compounds according to the invention satisfying equations $0.3 \leq x \leq 1$ and $0<v\leq 0.1$ are those positioned above line 3, having as the origin point P(0.3−0), a slope of approximately 0.143 and an end point Q(1−0.1), in other words when $0.3\leq x\leq 1$, v has to satisfy the relation $v>0.143(x-0.3)$.

For v equal to 1, there is LNA not forming part of the invention. The compounds according to the invention are those above line 4 (v=1) with as the origin S(0−1) and the end R(1−1).

For x equals 0, the prior art solid compounds of formula $LaMg(Ga_{1-v}Al_v)_{11}O_{19}$ not having the laser effect are obtained. The limit x=0 corresponds to the ordinate axis, whose origin is O(0−0) and whose end point is S(0−1).

In conclusion, the lanthanum-neodymium gallates according to the invention of formula $La_{1-x}Nd_xMg(Ga_{1-v}Al_v)_{11}O_{19}$ are those contained in the pentagon OPQRSO of formula 1.

As particular compounds belonging to this pentagon, reference is made to compounds J and K of formula:

$$La_{0.9}Nd_{0.1}Mg(Ga_{0.1}Al_{0.9})_{11}O_{19}$$

$$La_{0.9}Nd_{0.1}Mg(Ga_{0.6}Al_{0.4})_{11}O_{19}.$$

These gallates belonging to line 5 (x=0.1) of FIG. 1 correspond to the most widely chosen neodymium level for LNA.

The inventors have found that for x=0.1 and v between 0 and 1, there was a total solid solution, no matter what the value of v. These compounds have a hexagonal mesh and the crystalline parameters thereof were measured.

Figure 2:
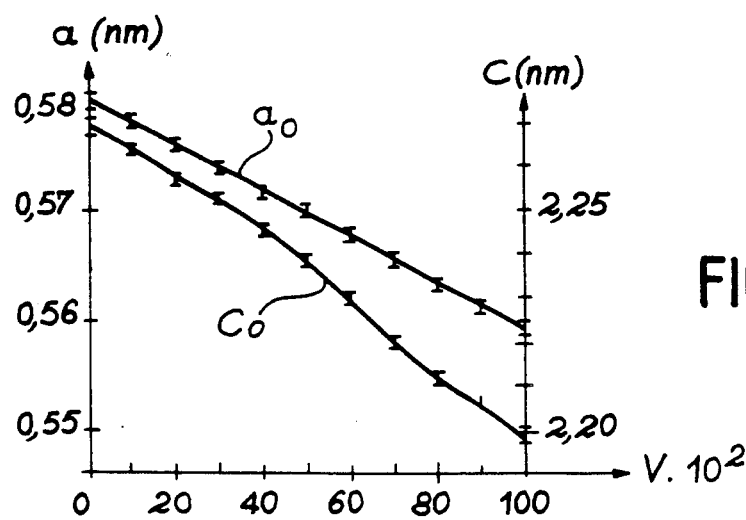
FIG. 2: The crystalline parameters a and c, expressed in nanometers, as a function of v for the gallates according to the invention of formula $La_{0.9}Nd_{0.1}Mg(Ga_{1-v}Al_v)_{11}O_{19}$.

FIG. 2 illustrates the continuous evolution of these crystalline parameters a and c of the hexagonal mesh of the compounds as a function of v, i.e. the aluminium composition, curve $a_0$ representing the evolution of the crystaline parameter a and curve $c_0$ that of crystalline parameter c.

The main optical properties or laser effects of the lanthanum-neodymium-magnesium aluminogallates according to the invention (FIG. 1) are linked with a reduction of the force of the crystal field at the site of the neodymium on substituting aluminium by gallium in LNA, as can be clearly gathered from FIG. 2.

It can be gathered from the latter that the neodymium-oxygen distance or spacing rises from pure aluminate to pure gallate. The increase in this distance makes it possible to reduce the self-quenching phenomenon of the fluorescence of the neodymium, thus making it possible to increase, compared with LNA, the quantity of active atoms for the laser effect.

The modifications of the crystal field are very favourable for the co-activation by $Cr^{3+}$ ions. Thus, the reduction of the crystal field, by increasing the neodymium-oxygen distances compared with LNA, brings about a displacement of the fluorescence bands of the chromium towards large wavelengths between 700 and 800 nm, precisely where are found the two intense bands of the neodymium absorption spectrum.

Consequently, the neodymium-based aluminogallates are much more promising than LNA in the case of chromium co-activation, which significantly improves the efficiency of laser emission. These aluminogallates are in particular of formula:

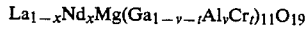

Other special examples of gallates according to the invention contained in the pentagon OPQRSO are those for which v=0.4, i.e. corresponding to formula:

designated by line 6 in FIG. 1. Several gallates complying with this formula, such as e.g. compound L of formula $La_{0.5}Nd_{0.5}MgGa_{6.6}Al_{4.4}O_{19}$ have been synthesized and the inventors have measured the fluorescence intensity $I_f$ of said gallates.

Figure 3:
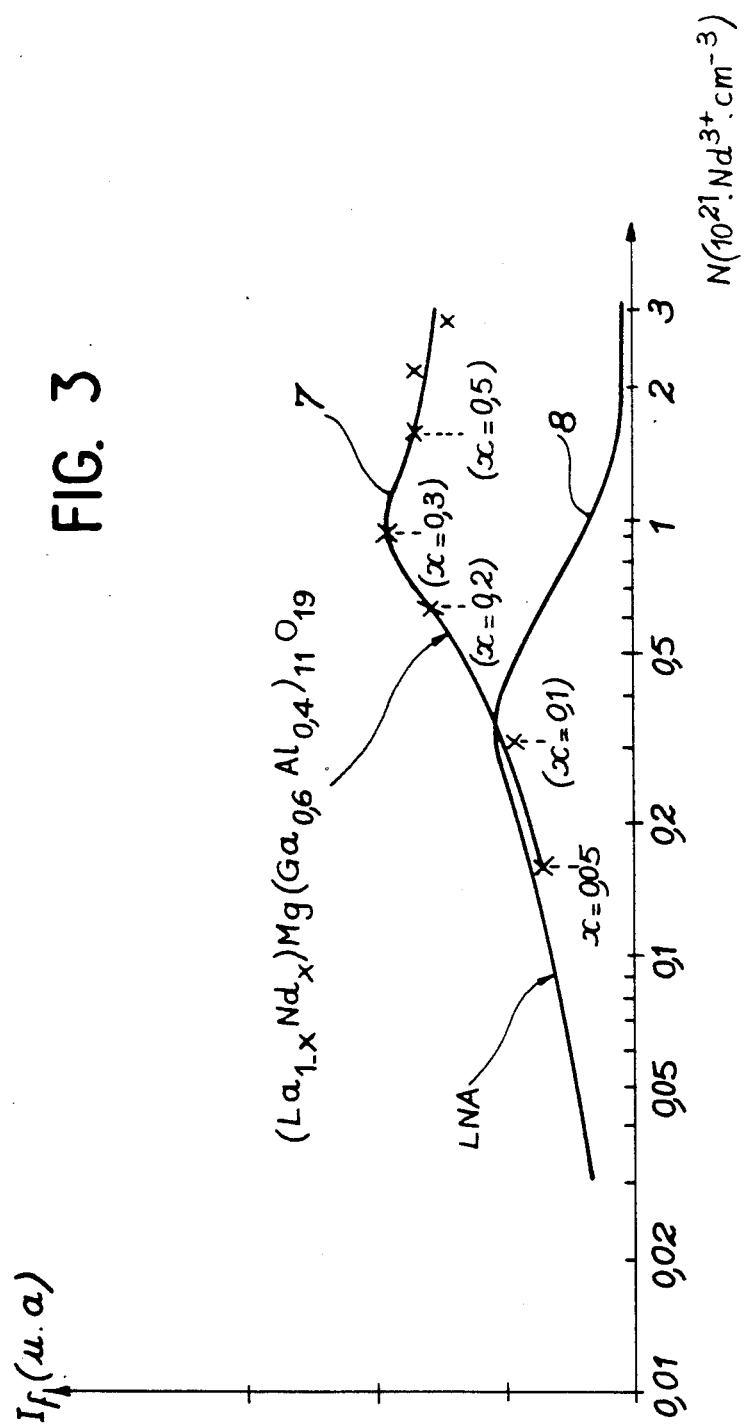
FIG. 3: The fluorescence intensity $I_{f3}$, in arbitrary units, as a function of the neodymium content/cm N for aluminogallate of formula $La_{1-x}Nd_xMg(Ga_{0.6}Al_{0.4})_{11}O_{19}$ (curve 7) and for LNA (curve 8).

The variations of the fluorescence intensity $I_f$ with the neodymium content N of said gallates are represented by curve 7 in FIG. 3, the fluorescence intensity having a maximum for $x \approx 0.3$. FIG. 3 also shows the variations of the fluorescence intensity $I_f$ with the neodymium content of the LNA of formula $La_{1-x}Nd_x$-$Mg(Al_{11}O_{19})$. These variations are represented by curve 8 and have a maximum for $x \approx 0.1$.

As a result of the partial substitution of the aluminium in the LNA by gallium, these curves show that it is possible to increase by a factor of 3 in the compound, the neodymium quantity corresponding to the fluorescence intensity maximum. However, as stated hereinbefore, the fluorescence intensity increases with the neodymium ion concentration. This can also be gathered from curves 7 and 8, because it is possible to obtain a double fluorescence intensity for the gallates. It is therefore very interesting to substitute part of the aluminium by gallium in LNA.

Conversely, from the standpoint of pure gallates, the partial substitution of the gallium by aluminium authorizes the introduction of neodymium in any proportion (x=1 and v=0 not existing). Moreover, this partial substitution of gallium by aluminium makes it possible to produce large monocrystals of an appropriate quality for a large number of laser applications.

Thus, lanthanum-neodymium gallates not substituted by aluminium (curve 1 of FIG. 1) cannot be obtained in the form of monocrystalline bars or rods of considerable size, the crystallogenesis of these pure gallates growing to be relatively difficult.

However, the monocrystals of gallates not substituted by aluminium and of small size can be of interest for producing microlasers. The monocrystals are obtained by melting or fusing the corresponding powder in a platinum crucible, followed by slow cooling.

The lanthanum-neodymium-magnesium alumogallates of formula $La_{1-x}Nd_xMg(Ga_{1-v}Al_v)_{11}O_{19}$ for which x ranges between 0.1 and 0.5 (including boundaries) would appear to be a good compromise as regards the quantity of neodymium ions, the life of the excited state $E_1$ and the fluorescence efficiency.

In FIG. 3, x=0.1 corresponds to a neodymium quantity of approximately $0.3 \cdot 10^{21}$ $Nd^{3+}$ ions per $cm^3$ and x=0.5 corresponds to approximately $1.6 \cdot 10^{21}$ $Nd^{3+}$ ions per $cm^3$.

In view of the fact that the life of the excited state $E_1$ decreases when the neodymium quantity increases and that conversely the fluorescence intensity increases when the neodymium quantity increases, the monocrystals for which x=0.1 are more particularly adapted to the production of continuously operating power lasers, whereas monocrystals for x exceeding 0.1 and in particular equal to 0.2, 0.3 or 0.4 are better adapted to the production of pulsed power lasers.

Figure 4:
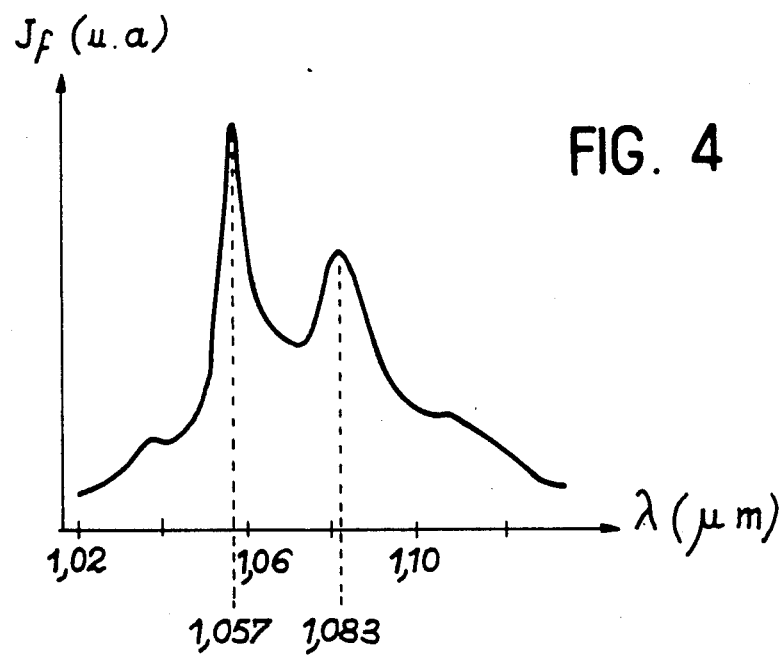
FIG. 4: The fluorescence spectrum of neodymium for a monocrystal of formula.

In particular, the fluorescence spectrum $J_f$, in arbitrary units, i.e. laser emission of the neodymium in the range of transition $^4F_{3/2} \rightarrow ^4I_{11/2}$ responsible for said laser effect is given in FIG. 4. This spectrum is that of the monocrystal of formula:

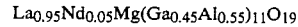

more particularly usable in a continuously operating, medium power laser. This fluorescence spectrum reveals the existence of two main transmission wavelengths at 1.057 and 1.083 micrometers. Althougth this cannot be gathered from the curve, this compound also has transmission wavelengths in the vicinity of 1.32 micrometers, which can also give the laser effect.

FIG. 5 diagrammatically shows a pulsed power laser using a mixed gallate according to the invention and emitting in the infrared. This laser comprises a laser cavity 10 containing a rod 12 of gallate according to the invention arranged parallel to the longitudinal axis 13 of the laser. This gallate is e.g. of formula:

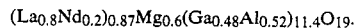

On either side of said rod are placed high intensity, elongated, xenon flash lamps 14, 16, oriented in accordance with the longitudinal axis 13 of the laser. These lamps 14, 16 make it possible to ensure a longitudinal optical pumping of the neodymium-based gallate rod 12.

The laser cavity 10 also comprises a quarter wave plate 18 transforming the linearly polarized incident light from rod 12 into circularly polarized light. Plate 18 is followed by a plane mirror 20 transmitting the light from the plate onto a divergent convex mirror 22. Following reflection on the latter, the widened light beam, which is circularly polarized and adapted, again passes through the quarter wave plate 18, thus producing a vertically polarized beam, which completely sweeps the amplifier medium or bar 12, whilst extracting the maximum light energy possible therefrom.

The laser beam, amplified in the direction of another highly reflecting, concave mirror 24 is interrupted by a polarizing prism 26 ejecting the polarized beam 28 vertically out of the laser. A convergent lens 30 makes it possible to obtain a parallel light beam.

This laser operating in pulsed manner is equipped with an electrooptical switch 32, normally a $Q_1$ switch and positioned between concave mirror 24 and output polarizer 26. When the switch is closed, i.e. a voltage is applied thereto, the laser cannot operate. Thus, during the "pumping" of the amplifier medium with neon lamps 14 and 16, polarizer 26 is transparent to the horizontally polarized photons and allows light to pass to switch 32. The latter rotates the polarization direction by 90° and prevents polarizer 26 from transmitting this light. Conversely, on opening $Q_1$ switch 32, the latter no longer alters the horizontal polarization from the polarizer, thus enabling the laser cavity 10 to amplify the light emitted by rod 12.

A diaphragm 33 can be inserted between the switch and polarizer in order to channel the laser light.

The replacement of the neodymium-magnesium gallate rod 12 by a praseodymium-magnesium gallate according to the invention, e.g. of formula $La_{1-x}Pr_x\text{-}MgGa_{3.3}Al_{7.7}O_{19}$ or $La_{1-x}Pr_xMgGa_{6.6}Al_{4.4}O_{19}$ with $0<x<1$ leads to a power laser emitting in the visible range and in particular in the yellow and red. It is merely necessary to adapt the coating of mirrors 22, 24 to the sought laser emission wavelength.

In the same way, it is possible to use a rod 12 containing cerium in place of neodymium to obtain a wavelength-tunable power laser emitting in the ultraviolet or visible and in particular in the blue-violet. It is possible to use for this purpose a compound of formula $La_{1-x}Ce_xMgGa_{5.5}Al_{5.5}O_{19}$ with $0<x\leq 1$.

In this case, in order to tune the wavelength of the laser, a prism or network-type wavelength selection device 34 is inserted between plate 18 and mirror 20.

In the same way, it is possible to obtain a tunable power laser emitting in the red and near infrared by using a gallate or aluminogallate monocrystal containing as the laser activator, chromium in place of the neodymium rod 12.

Other examples of magnetoplumbite-type aluminogallates according to the invention and complying with formula (I) are:

$$La_{1-x}Nd_xMg(Ga_{0.3}Al_{0.6}Se_{0.1})_{11}O_{19}$$

$$La_{1-x}Nd_xMg(Ga_{0.4}Al_{0.5}In_{0.1})_{11}O_{19}$$

in which part of the aluminium is substituted by scandium or indium, $z=t=0$ and $k=1$.

It is also possible to totally substitute the aluminium in the gallates according to the invention by scandium or indium, as is shown by the following compounds:

$$La_{0.9}Nd_{0.1}Mg(Ga_{0.9}Sc_{0.1})_{11}O_{19}$$

$$La_{0.9}Nd_{0.1}Mg(Ga_{0.9}In_{0.1})_{11}O_{19}$$

Certain magnetoplumbite-type gallates according to the invention of formula (I) can have oxygen vacancies, which corresponds to $k\neq 1$. An example of a gallate with $k\neq 1$ is the compound:

$$(La_{0.7}Nd_{0.3})_{0.98}Mg_{0.98}(Ga_{0.6}Al_{0.4})_{10.78}O_{18.62}$$

in which $k=0.98$ and $z=t=0$.

Laser types other than that described hereinbefore can obviously be equipped with a gallate monocrystal according to the invention and in particular those in which optical pumping takes place by means of a laser and not lamps. As an example, a description will now be given of the production of aluminogallate monocrystals according to the invention by Czochralski pulling, which is well known in the art.

The melting or fusion of magnetoplumbite-type aluminogallates according to the invention is not generally congruent, so that the pulling of monocrystals is only possible from a molten bath enriched or depleted with respect to one of its constituents. The material is melted in an iridium crucible under a slightly oxygenated, neutral atmosphere. A refractory material setup (alumina+MgO powder) installed around the crucible makes it possible to bring about a maximum limitation to the thermal gradients. The crucible is heated by an induction furnace. The assembly constituted by the crucible and furnace is enclosed in a water-cooled, hermetic enclosure.

In the absence of nuclei of a new compound according to the invention, pulling takes place from a slit iridium nucleus holder, which rotates at 10 to 20 r.p.m. It is necessary to use very low translation speeds, in view of the composition difference existing between bath and crystal. Speeds of approximately 0.5 to 1 mm per hour give good results.

On the basis of the crystal obtained, it is possible to obtain by cleaving good quality monocrystalline plates making it possible to optically characterize the compound, as well as large rods usable as a laser source.

The following table gives examples of lanthanum-neodymium-magnesium aluminogallate monocrystals obtained by Czochralski pulling. The left-hand part of the table gives the molar % composition of the molten bath on the basis of which the monocrystal is obtained, whilst the right-hand part of the table gives the formula of the monocrystal obtained on the basis of the corresponding molten bath.

| EXAMPLES OF MONOCRYSTALS OBTAINED BY CZOCHRALSKI PULLING | | | | | |
|---|---|---|---|---|---|
| Molten bath composition in mole % | | | | | Crystal obtained from the molten bath |
| $La_2O_3$ | $Nd_2O_3$ | MgO | $Ga_2O_3$ | $Al_2O_3$ | Composition |
| 14.84 | 1.76 | 10.86 | 47.60 | 24.94 | $(La_{0.95}Nd_{0.05})Mg_1(Ga_{0.45}Al_{0.55})_{11}O_{19}$ |
| 16.71 | 2.55 | 10.37 | 47.96 | 22.41 | $(La_{0.90}Nd_{0.10})Mg_1(Ga_{0.45}Al_{0.55})_{11}O_{19}$ |

-continued

EXAMPLES OF MONOCRYSTALS OBTAINED BY CZOCHRALSKI PULLING

| Molten bath composition in mole % | | | | | Crystal obtained from the molten bath |
|---|---|---|---|---|---|
| $La_2O_3$ | $Nd_2O_3$ | MgO | $Ga_2O_3$ | $Al_2O_3$ | Composition |
| 6.92 | 0.77 | 7.69 | 50.79 | 33.83 | $(La_{0.95}Nd_{0.05})_{0.87}Mg_{0.6}(Ga_{0.37}Al_{0.63})_{11.4}O_{19}$ |
| 6.97 | 0.79 | 7.70 | 51.40 | 33.14 | $(La_{0.95}Nd_{0.05})_{0.87}Mg_{0.6}(Ga_{0.44}Al_{0.56})_{11.4}O_{19}$ |
| 7.10 | 1.11 | 7.49 | 53.31 | 30.99 | $(La_{0.90}Nd_{0.10})_{0.87}Mg_{0.6}(Ga_{0.46}Al_{0.54})_{11.4}O_{19}$ |
| 7.24 | 1.29 | 7.67 | 55.84 | 27.96 | $(La_{0.88}Nd_{0.12})_{0.87}Mg_{0.6}(Ga_{0.48}Al_{0.52})_{11.4}O_{19}$ |
| 7.16 | 2.39 | 7.59 | 55.21 | 27.65 | $(La_{0.80}Nd_{0.20})_{0.87}Mg_{0.6}(Ga_{0.48}Al_{0.52})_{11.4}O_{19}$ |

What is claimed is:

1. A power laser tunable in the red and near infrared, which comprises, as an emitter, a monocrystal of a mixed gallate of the formula $$LaMg(Ga_{1-v-t}Al_vCr_t)_{11}O_{19}$$

wherein $0 \leq v < 1$ and $t \neq 0$, and wherein said power laser further comprises means for tuning said power laser in the red or near-infrared.

2. A power laser of a mixed lanthanide-magnesium gallate, of the formula:

$$[La_{1-x}M^1_x]_{(1-z/3)k}Mg_{(1-z)k}[Ga_{1-v-t}M^2_vCr_t]_{(11+z)k}O_{19k}$$

in which $M^1$ is selected from the group consisting of neodymium, praseodymium, cerium, neodymium-cerium and praseodymium-cerium pairs, said elements being trivalent; $M^2$ represents at least one trivalent element selected from the group consisting of aluminum, scandium and indium, provided that the total number of scandium and indium atoms per formula unit is below $0.15(11+z)k$; k represents a number from 0.94 to 1; x represents a number from 0 to 1; t represents a number such that $0 \leq t \leq 0.05$, provided that t is $=0$ when $x \neq 0$, and x is $=0$ when $t \neq 0$; v represents a number such that $0 \leq v+t < 1$; z represents a number from 0 to 0.5 and wherein the gallate is monophase and has a hexagonal magnetoplumbite-like crystalline structure.

3. A power laser emitting in the infrared, which comprises, as an emitter, a monocrystal of a mixed gallate according to claim 2, wherein $M^1$ is neodymium.

4. A power laser emitting in the visible range, which comprises, as an emitter, a monocrystal of a mixed gallate according to claim 2, in which $M^1$ is selected from the group consisting of praseodymium and praseodymium-cerium.

5. A power laser as emitting in the ultraviolet or visible, which comprises, as emitter, a monocrystal of a mixed gallate according to claim 2, in which $M^1$ is cerium.

6. A laser according to claim 2, wherein $M^2$ represents aluminum.

7. A laser according to claim 2, wherein $M^1$ represents neodymium.

8. A laser according to claim 7, wherein x is in the range from 0.1 to 0.5.

9. A laser according to claim 7, wherein said gallate is of the formula:

$$La_{1-x}Nd_xMgGa_{11}O_{19}$$

in which x is such that $0 < x < 0.3$.

10. A laser according to claim 7, wherein $x=1$ and v exceeds 0.1.

11. A laser according to claim 7, wherein said gallate is of the formula:

$$La_{1-x}Nd_xMg(Ga_{1-v}Al_v)_{11}O_{19}$$

provided that $v > 0.143(x-0.3)$ for $0.3 < x < 1$.

12. A laser according to claim 2, wherein said gallate is of the formula:

$$La_{1-x}Nd_xMg(Ga_{0.6}Al_{0.4})_{11}O_{19}, \text{ with } 0 < x < 1.$$

13. A laser according to claim 2, wherein said gallate is of the following formula:

$$La_{1-x}(Nd_{1-p}Ce_p)_xMg(Ga_{1-v}Al_v)_{11}O_{19}$$

p being a number such that $0 < p < 1$.

14. A laser according to claim 13, wherein v equals 0.5 and x equals 0.2 or 0.5.

15. A laser according to claim 2, wherein said gallate is of the following formula:

$$La_{1-x}Nd_xMg(Ga_{1-v-t}Al_vCr_t)_{11}O_{19}$$

with $0 < x < 1$, $0 < v < 1$ and $t=0$.

16. A laser according to claim 15, wherein v equals 0.7 or 0.4.

17. A laser according to claim 2, wherein said gallate is of the formula:

$$La_{1-x}Pr_xMg(Ga_{1-v}Al_v)_{11}O_{19}$$

with $0 < x < 1$.

* * * * *